United States Patent [19]

Robusto et al.

[11] 3,967,151

[45] June 29, 1976

[54] SUSTAINED CONDUCTIVITY DEVICE COMPRISING A PLURALITY OF SCHOTTKY BARRIERS

[75] Inventors: Paul F. Robusto, Huntington Beach: Craig P. Stephens, Oceanside, both of Calif.

[73] Assignee: Hughes Aircraft Company, Culver City, Calif.

[22] Filed: May 30, 1975

[21] Appl. No.: 582,543

Related U.S. Application Data

[62] Division of Ser. No. 415,049, Nov. 12, 1973, Pat. No. 3,928,671.

[52] U.S. Cl. .................... 313/398; 313/463; 357/15

[51] Int. Cl.[2] .................... H01J 29/10; H01J 31/08; H01L 29/48

[58] Field of Search ........... 313/392, 398, 391, 394, 313/397, 463

[56] References Cited

UNITED STATES PATENTS

| | | | |
|---|---|---|---|
| 3,368,093 | 2/1968 | Sjoberg et al. | 313/397 |
| 3,681,638 | 8/1973 | Bleha et al. | 313/398 |
| 3,908,148 | 9/1975 | Lehrer et al. | 313/398 |

*Primary Examiner*—Robert Segal
*Attorney, Agent, or Firm*—Donald C. Keaveney; W. H. MacAllister

[57] ABSTRACT

An electrical field sustained conductivity device is fabricated by successively disposing over a layer of cadmium sulfide a film of metal particles and a composite layer of metal particles in an insulating medium. When a potential is applied across the cadmium sulfide layer, an image may be stored therein by momentarily exposing the layer to electrons or light conveying that image. Such exposure introduces conductivity changes in the cadmium sulfide layer by virtue of the layers deposited on it and the conductivity changes are retained so long as the applied potential is maintained.

8 Claims, 3 Drawing Figures

SUSTAINED CONDUCTIVITY DEVICE COMPRISING A PLURALITY OF SCHOTTKY BARRIERS

The invention described herein was made in the course of, or under a contract with, the Department of the Air Force.

This is a division of application Ser. No. 415,049, filed Nov. 12, 1973.

BACKGROUND OF THE INVENTION

In Lehrer et al. U.S. Pat. Nos. 3,344,300 and 3,398,021 assigned to the assignee of the present invention and respectively entitled "Field Sustained Conductivity Devices with CdS Barrier Layer," and "Method of Making Thin Film Field Sustained Conductivity Device," there are respectively described an electrical field sustained conductivity device and a process for its fabrication. The device consists essentially of a cadmium sulfide layer sandwiched between a pair of electrodes, with one of the electrodes being supported by a transparent substrate. By means of a heat-treating technique described in the patents, a barrier region is created in the cadmium sulfide adjacent to the electrode opposite the one being supported by a transparent substrate, depending upon the particular steps employed in processing the cadmium sulfide.

Devices of the above type have an asymmetrical conductivity so that for a given voltage applied between their electrodes, a much lower current flows through the dielectric when the electrode next to the barrier region is at a lower potential than is the other electrode. This is known as the reverse bias condition of the device and it is in this state that it is ordinarily operated by applying a constant reverse biasing voltage between its electrodes. When the device in its reverse biased condition is exposed to electron bombardment or to illumination, the conductivity of the cadmium sulfide layer is increased and this increased conductivity is retained even after excitation ceases. Thus, current flow is increased in the reverse direction through the cadmium sulfide until the device is restored to its low reverse conductivity state by momentarily interrupting or reversing its applied bias.

A particularly useful application of the device described in the Lehrer patents is the control of an electroluminescent layer for displaying an image. The electroluminescent layer is disposed between one of the electrodes and the cadmium sulfide layer so that conductivity changes sustained in the cadmium sulfide layer change the imposed voltage across the electroluminescent layer and thereby alter its luminescence. Thus, information may be displayed for an extended period of time on the electroluminescent layer by momentarily scanning the device by means of an electron beam modulated with a signal representing the image to be displayed.

An improved method for fabricating a device of the type disclosed in the Lehrer et al. patents is described in Scholl et al., U.S. Pat. No. 3,716,406, also assigned to the present assignee and entitled "Method for Making a Cadmium Sulfide Thin Film Sustained Conductivity Device." The principal feature of the Scholl et al. process lies in the manner of forming the barrier region in the cadmium sulfide layer. In the Lehrer et al. process the cadmium sulfide layer and the electrode adjacent to it are heated in a sulfur-containing atmosphere, with the electrode material being selected to react in such an atmosphere with the cadmium sulfide. In the Scholl et al. method, the electrode adjacent the cadmium sulfide is selected so as not to react with it and a sulfur-containing atmosphere is not used. Instead, a composite film of gold and silicon monoxide is deposited on the cadmium sulfide layer to create the barrier regions. The top electrode is then deposited upon the composite film.

An alternative method disclosed in the Scholl et al. patent includes the deposition of a monolayer of metal particles, such as silver, on the surface of the cadmium sulfide film, followed by a layer of dielectric such as silicon monoxide.

The Scholl process, which represents an improvement over that of Lehrer et al., is believed by applicants to operate through two related phenomena: "storage sites" and "barrier regions". In the case where a composite film such as a mixed co-evaporated layer of gold and silicon monoxide is formed on the cadmium sulfide layer, the particles of gold are believed to create barrier regions, also known as Schottky barriers, on the surface of the cadmium sulfide as well as storage sites in the body of the composite film. It had been previously theorized that the metal particles served to create only the Schottky barriers, and it was believed that the storage sites existed in the cadmium sulfide. The same was also believed to be the phenomena underlying the operation of the device when a layer of silver particles covered by a silicon oxide layer was used.

SUMMARY OF THE INVENTION

Following applicants' discovery that the metal particles caused both the creation of the storage sites and the creation of the Schottky barriers, an attempt was made to discover whether these two functions could not be separated, each being performed by a distinct layer of particles. This was done and the resulting method and device produced thereby are the subject of the present invention.

In particular, it has been discovered that the necessary barrier regions in the cadmium sulfide may be created by forming a layer of metal particles, preferably a mono-layer of silver platelets, on a surface of the cadmium sulfide and that the necessary charge storage sites may be created substantially independently of the barrier regions by distributing metal particles in an oxide layer overlying the layer of silver platelets so as to produce a cermet, or composite, layer. By separating the process steps whereby the carrier regions and the storage sites are created, each may be optimized without compromising the other. Moveover, the Schottky barriers created by silver platelets in the cadmium sulfide are more reproducible than those produced by the co-evaporation of gold and silicon monoxide. However, the latter process has been found to produce reproducible and effective charge storage sites. Thus, by combining the steps of depositing metal particles and then depositing a cermet layer it has been found that the operating characteristics of display tubes using electrical field sustained conductivity devices to modulate an electroluminescent display panel has been significantly improved.

A particularly significant improvement derived from the present invention has been observed in the erase factor of such tubes, this being the ratio of the sustained current to erase current, the latter being the current that flows through the device after momentary removal of the fixed bias voltage thereon. This increase in erase factor has greatly improved both the visual and electrical characteristics of the device. Although its principal application lies with electroluminescent storage display tubes, the present invention is also applicable to liquid crystal displays, since they too are voltage responsive. Thus, the electrical field sustained conductivity device of the present invention may be integrated with a layer of liquid crystal material to produce a display device with "memory". The same also holds true for other visibly voltage-responsive materials, such as electrophoretic suspensions.

BRIEF DESCRIPTION OF EXEMPLARY EMBODIMENT OF THE INVENTION

Figure 1:
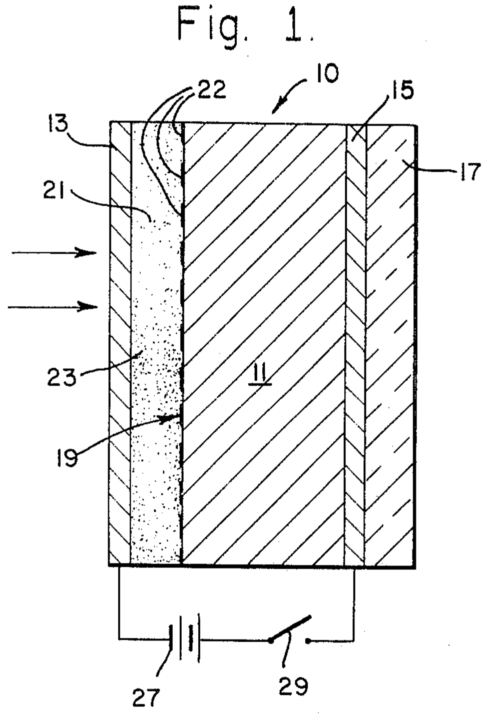
FIG. 1 is a combined cross-sectional illustration and schematic drawing of an electrical field sustained conductivity device fabricated in accordance with the present invention.

Referring now to FIG. 1, an electric field sustained conductivity device 10 in accordance with the present invention includes a cadmium sulfide photoconductive layer 11 sandwiched between a top electrode 13 and a bottom electrode 15, the latter of which rests upon a glass substrate 17 for mechanical support.

In keeping with the present invention, two additional layers 19 and 21 are disposed between the cadmium sulfide 11 and the top electrode 13. Disposed immediately next to the cadmium sulfide 11 is a discontinuous metal layer 19 which is operative to create Schottky barriers in the surface of the cadmium sulfide. Overlying the metal layer 19 is a composite film having ionizable sites due to conductive particles dispersed in an oxygen-containing insulating medium.

Preferably, the metal layer 19 comprises a discontinuous single layer of silver platelets 22 on the order of six microns or less. The overlying film 21 is preferably a cermet of gold particles 23 co-evaporated with silicon monoxide in the manner described in the above-referenced Scholl et al. patent.

As explained briefly above, operation of the electrical field sustained conductivity device 10 of FIG. 1 depends upon the presence of charge storage sites in the cermet layer 21 and upon the Schottky barriers created by the silver platelets 22. At charge storage sites created by the presence of the gold particles 23, the binding potential of outer shell applied electrons can be surpassed by establishing a sufficient field across the cermet, permitting them to be removed by an applied electric potential. The sites from which an electron is removed become positive. In operation of the device a direct potential is applied, as from a source 27 and through a switch 29, so as to maintain the bottom electrode 15 positive relative to the top electrode 13, thereby reverse biasing the Schottky barriers formed under the silver platelets 22.

To store a charge pattern of an image in the device, the latter is exposed to radiation in the form of a beam of light or of electrons through the layers 13, 21, and 19. In the case of photon excitation an alternative would be to use a transparent electrode 15 and expose the device through the transparent substrate 17.

The incident radiation creates hole-electron pairs in the cadmium sulfide layer. The electrons migrate to the bottom electrode 15 and are swept away to the voltage source 27. The holes travel to the Schottky barrier layer created by the silver platelets 22 and recombine with electrons, causing a positive charge to be built up at the surface. This charge quickly becomes large enough to tear electrons from the charge storage sites in the composite cermet layer 21. These electrons flow to the barrier region where they recombine with holes. The sites from which an electron has thus been removed acquire a positive charge and may be referred to as ionized charge storage sites. Each ionized site reduces the reverse bias of the Schottky barriers under it, resulting in an increased electron current flow from the top electrode 13 through the cadmium sulfide layer 11 to the bottom electrode 15.

Figure 3:
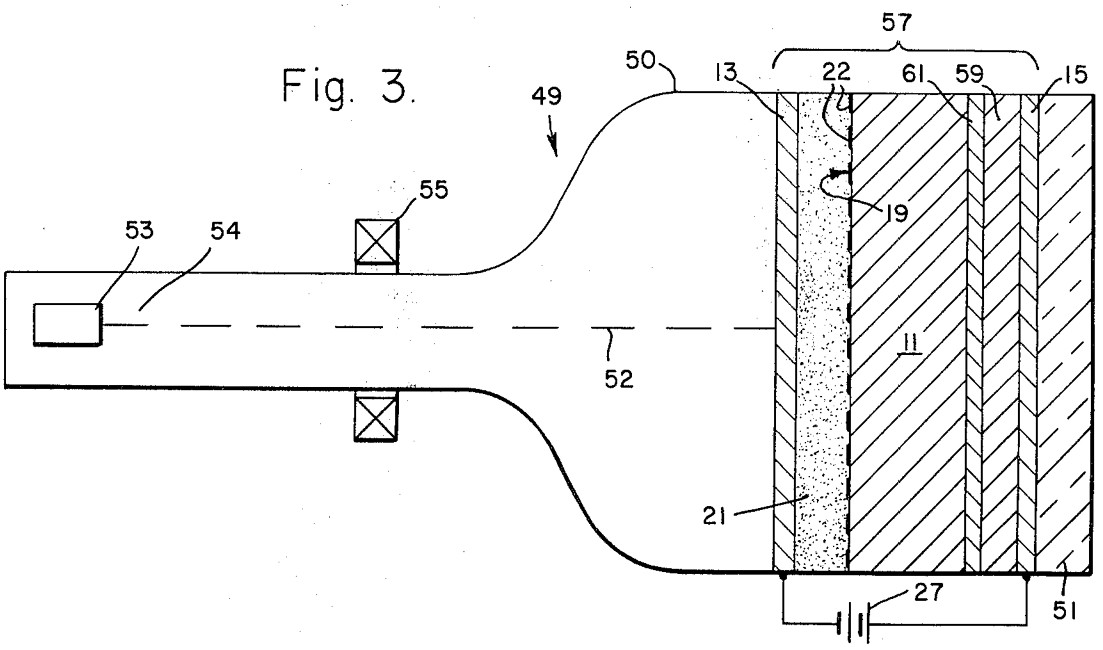
FIG. 3 illustrates a storage display tube incorporating a device of the type illustrated in FIG. 1.

If the entire device 10 is exposed to radiation, such as light or electrons momentarily, the ohmic current flowing from the bottom electrode 15 to the top electrode 13 will increase uniformly throughout the device and will continue to do so even after the incident radiation has ceased, so long as the biasing potential continues to be applied through the switch 29. Where the incident radiation carriers information, so that the device is exposed to nonuniform radiation, various portions of the device throughout its cross-section will carry current in proportion to the degree of radiation to which they have been exposed. Those regions of the device exposed to the greatest radiation will carry the largest current and will appear to have the highest conductivity to electric current. It is this conductivity which is "sustained" by the electrical field maintained by the voltage source 27. The image to which the device is momentarily exposed is thus stored in the form of a conductivity distribution or current distribution throughout the device and may be displayed by inserting an electroluminescent layer between the bottom electrode 15 and the cadmium sulfide layer 11. Such a device, shown in and described with reference to FIG. 3, is viewed through the substrate 17 which is made transparent for that purpose.

Next to be described is a method for fabricating the electrical field sustained conductivity device 10 in accordance with the present invention. The method to be described will be that for fabricating a preferred embodiment of the exemplary device, it being understood that alternatives exist in the choice of materials used, at least to the extent pointed out hereinafter. Since several of the steps and the equipment used to carry them out are the same as those described in the above-referenced Scholl patent, the latter is incorporated herein by reference.

The initial step in fabricating the device 10 is to obtain or manufacture a glass substrate 17 sufficiently thick to provide mechanical support and coated with tin oxide sufficiently thin to serve as a transparent electrode. If only the device 10 illustrated in FIG. 1 is to be fabricated and an electroluminescent layer is not to be sandwiched between the electrode 15 and the cadmium sulfide layer 11, the deposition of the cadmium sulfide layer follows next. With the equipment illustrated in the Scholl et al. patent and in the manner explained therein, a cadmium sulfide film between about 5 and 12.5 microns is deposited, care being taken to maintain the chamber in which the deposition is carried out at a lower temperature than that of the substrate.

As further explained in the Scholl et al. patent, the partially fabricated device is next placed in a quartz, ceramic, or metal tube in a controllable furnace where it is maintained at an elevated temperature between 385°C and 525°C for a period of between one minute and one hour in an argon atmosphere. The devices are then allowed to cool by physically removing the quartz tube from the furnace. After a further 20 minutes, when the devices have cooled to about 70°C, they are removed from the quartz tube.

To apply the silver platelets 22 which are the preferred form of the discontinuous metal film 19, an artist's brush may be used quite effectively. In this connection it has been found that the shape of the particles is important and that the platelet shape is to be preferred because it will adhere best to the cadmium sulfide surface. The platelets may be applied by gently rotating the brush in successive strips across the surface of the cadmium sulfide 11 until an even layer on the order of an eighth of an inch thick is formed. Excess platelets are removed first by tilting the substrate 17 and then by sweeping a dry nitrogen hose rapidly over the surface so as to remove the platelets evenly. The process is complete when the surface begins to assume a mirror sheen, at which point there is a single discontinuous layer of silver particles adhering to the cadmium sulfide, spaced apart from each other by less than half a micron.

The key characteristic of the silver platelets 22 is that silver forms a non-ohmic contact with the cadmium sulfide layer 11.

Silver platelets were obtained from Microcircuits Company of New Buffalo, Michigan, as a metallic silver powder. Upon analysis it was found tht the purity of the silver platelets in the powder was 99.9% and the silver powder contained between 1.5–2% volatile carriers such as stearic acids.

The platelet size for a particular batch used is shown by the following table:

| Material | 10% Below | 50% Below | 90% Below | 100% Below | Average Particle Size |
|---|---|---|---|---|---|
| Batch 1 | 1.4μ | 2.9μ | 5.5μ | 10μ | 2.9μ |
| Batch 2 | 1.8μ | 4.2μ | 6.0μ | 10μ | 4.2μ |

Other metals which would form non-ohmic contacts are gold, copper, nickel, palladium, and platinum. None of these have been available in the platelet form in which the silver has been found to function and have been tested only in the form of a slurry. In that non-platelet form, no powder works particularly well, not even silver. It is believed, however, that if these other metals were available in a platelet or flake form, they too could be used to create the Schottky barriers. This is particularly true of gold, palladium, and platinum, particularly because of their barrier height which is comparable to that of silver.

Figure 2:
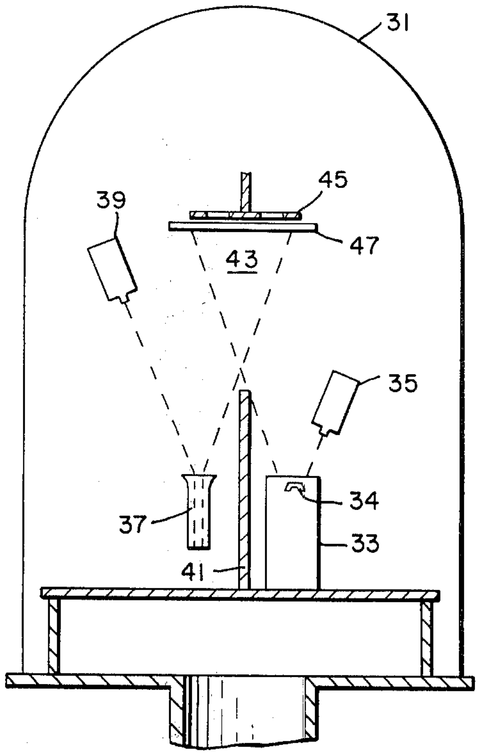
FIG. 2 illustrates an apparatus used to carry out the co-evaporation of a metal-oxide composite layer of a device illustrated in FIG. 1.

Having formed the film 19, the next step is to deposit the preferred gold-silicon monoxide cermet layer 21. The equipment and procedure for doing this are virtually identical to those illustrated in and described with reference to FIG. 4 of the above-referenced Scholl et al. patent. Because of a minor modification, however, the equipment and procedure are shown in, and will be explained with reference to FIG. 2 of the present application.

The co-evaporation of gold and silicon monoxide is carried out in a vacuum chamber 31 containing an electron beam evaporator 33 for the gold and a Drumheller source 37 for the silicon monoxide. The evaporation rate of the gold and the silicon monoxide are measured and controlled by a pair of rate monitors 35 and 39. In order to obtain the highest accuracy in measuring the rate of evaporation of gold, the monitor 35 should be placed as close as possible to the electron beam gun crucible 34 which holds the gold. For this reason a monitor of the ionization counter type should be used because this type of monitor does not intercept the stream of particles but rather permits them to pass through the instrument. In this way a buildup which would saturate other types of monitors is avoided. The accuracy obtained by this method of monitoring is an order of magnitude better than that disclosed in the Scholl et al. patent. Nevertheless, if the gold-silicon monoxide layer produced by this method were to be used to form Schottky barriers, they would still not be as reproducible as those formed by use of the silver platelets of the present invention. As explained previously, however, the gold-silicon monoxide layer 21 produced by the method just described does serve to form charge storage sites satisfactory for operation of the electrical field sustained conductivity device of FIG. 1.

A shield 41 prevents each of the monitors 35 and 39 from receiving particles from the source which is to be measured by the other but permits the evaporant streams to mix in the region 43 and it is in this region that deposition of the composite film 21 occurs. As the substrates 17 emerge from the step during which the cadmium sulfide layer 11 is deposited, they are placed on a rotating substrate holder 45, shielded by a shutter 47. The chamber 31 is pumped down to between $3\times10^{-6}$ and $5\times10^{-6}$ Torr. The rates of the individual evaporants are then set to a predetermined level so as to yield the desired composition. The shutter 47 is opened and the film 21 is deposited for a fixed time at the preset rates to yield the desired thickness.

The percentage of gold may vary between 1% and 5% with 2.6% having been found optimal. The desired thickness of the layer 21 may vary greatly depending upon the particular device application. Between 1,800 and 1,900 angstroms has been found to work well and has been attained with flow rates of 400 angstroms per minute and 11 angstroms per minute for the silicon monoxide and the gold respectively. The rates are not critical, however, and may vary so long as they yield the desired composition. Similarly, the total evaporation time will depend upon the desired film thickness, typical times being in the range of 3 to 8 minutes.

Fabrication of the device of FIG. 1 is completed by formation of the top electrode 13.

To summarize with reference to the composite film 21, its composition is the same as that described in the Scholl et al. patent except that it is more accurately controlled because of the monitoring technique described herein with reference to the monitor 35. Similarly, the range of alternatives described in the Scholl et al. patent for the gold and the silicon monoxide apply equally to the layer 21 described herein. Thus, aluminum, silver, platinum, and tin may be substituted for the gold, and other dielectrics such as magnesium oxide may be substituted for the silicon monoxide.

A storage tube 49 incorporating an electrical field sustained conductivity device of the type illustrated in FIG. 1 is shown in FIG. 3. It is similar to the storage display tube shown and described in the above-referenced Lehrer et al. U.S. Pat. No. 3,344,300. In the patent, the shortcomings of alternative storage display tube structures are described and the advantages of such a storage display tube utilizing an electrical field sustained conductivity device in combination with a layer of electroluminescent material whose light output is modulated by an electric field controlled by the device is explained. The storage tube illustrated in FIG. 3, herein is substantially the same as that described in the Lehrer et al. patent except for the manner in which the barrier regions are created in its cadmium sulfide layer.

The storage display tube 49 comprises an evacuated envelope 50 having a transparent faceplate 51 toward which a beam of electrons 52 is aimed from a cathode 53 by an electron gun containing an intensity modulating grid 54. A conventional deflection yoke 55 around the neck of the tube 50 serves to provide the means whereby the electron beam 52 may be periodically scanned across a target structure 57 which is built up on the substrate 51.

Portions of the target structure 57 have already been described. They are the elements which make up the electrical field sustained conductivity device 10 illustrated in FIG. 1. These portions are identified in FIG. 3 with the same reference numerals used to identify them in FIG. 1. The function of the substrate 17, however, is performed by the faceplate 51. The process of fabricating the target structure 57 differs from that described for making the sustained conductivity device of FIG. 1 in that two additional layers 59 and 61 are interposed between the bottom electrode 15 and the cadmium sulfide layer 11. An electroluminescent layer 59 is deposited upon the transparent bottom electrode 15 and may be formed from any of the materials described in the referenced Lehrer et al. U.S. Pat. No. 3,344,300. The preferred material is zinc sulfide doped with a manganese activator and copper and then vacuum annealed so as to recrystalize the zinc sulfide and diffuse the copper. A dark, optically opaque layer 61 of germanium is then placed on the electroluminescent layer 59 so as to prevent light feedback from exciting the cadmium sulfide layer 11 which might cause spreading of the image.

In operation of the storage display tube 49, a DC potential is applied across the electrodes 13 and 15 from the voltage source 27. Initially, before activation of the electron beam gun 53, most of the potential drop between the electrodes 13 and 15 occurs across the cadmium sulfide layer 11 and the potential across the electroluminescent layer 59 is not sufficient to generate light therein. On actuation of the gun 53, the incident electron beam 52 initiates the radiation-induced cnductivity phenomenon described with reference to FIG. 1, causing the impedance of the layer 11 to drop in its path. In the areas of reduced impedance, the major portion of the field applied between electrodes 13 and 15 is shifted to the electroluminescent layer 59, causing it to generate light in the written areas. Because of the sustained conductivity phenomenon, the electroluminescent layer 59 continues to emit light even after removal of the electron beam 52.

To determine the quality of performance obtainable from a storage display tube illustrated in FIG. 3, a target structure of the type used therein and incorporating features of the present invention was compared with a similar target structure wherein the techniques disclosed in the Scholl et al. patent for the fabrication of the barrier regions was used. In particular, the Scholl at al. type of device included a silver powder layer disposed next to the cadmium sulfide and covered by a layer of silicon monoxide. The device representing the present invention, on the other hand, included a monolayer of silver platelets covered with a gold-silicon monoxide cermet. Both of the target structures included the same type of electroluminescent film and anti-feedback layer sandwiched between their cadmium sulfide layer and bottom electrode. Also both of them were of the same size, 5 inches in diameter, and a 2 ½ inch square of those target structures was tested.

The dominant improvement observed was an increase in the erase factor. This was determined by initially writing on the targets with an electron beam for 5 seconds in a vacuum tube. Five seconds later, the current flowing through the targets was measured, giving the value of the "sustained current". Five seconds after the measurement of the sustained current, the voltage across the devices was dropped to zero and was then returned to the original target voltage. Five seconds later, the current flowing through the targets, called the "erase current", was measured. The ratio of the sustained current to the erase current is the erase factor. The average erase factor of 17 tubes with the silicon oxide-silver layers was found to be 2.3. The average erase factor of a similar number of tubes with the silver/gold-silicon monoxide cermet was 3.4. This 50% increase in the erase factor represents a significant improvement, both in the visual and electrical characteristics of the target structure, and of a storage display tube employing it.

What is claimed is:

1. An electrical field sustained conductivity device comprising:

a. a pair of spaced-apart electrodes and a layer of heat-treated cadmium sulfide between said electrodes;

b. a discontinuous metal layer on one surface of said cadmium sulfide, operative to create Schottky barriers in said surface of the cadmium sulfide; and c. an ionizable composite film on said discontinuous metal layer, said composite film having conductive particles dispersed in an oxygen-containing insulating medium.

2. The device of claim 1 characterized further in that said metal layer consists of individual platelets, each less than ten microns in diameter.

3. The device of claim 2 characterized further in that said metal is selected from a group consisting of silver, gold, copper, nickel, palladium, and platinum.

4. The device of claim 2 characterized further in that said conductive particles of said composite film are selected from a group consisting of gold, aluminum, silver, platinum, copper, nickel, palladium and tin, and in that the insulating medium of said composite film is silicon monoxide.

5. In a direct viewing electronic storage display device, having means for scanning with an electron beam an improved display panel positioned to be scanned by said electron beam and comprising:

a. an optically transparent, electrically insulating substrate;

b. an optically transparent, electrically conductive layer disposed on said substrate;

c. an electroluminescent layer capable of having its luminescence modulated in response to an electrical field established thereacross disposed on said electrically conductive layer;

d. an optically opaque electrically insulating layer disposed on said electroluminescent layer;

e. a layer of cadmium sulfide disposed on said optically opaque layer;

f. a layer of metal platelets disposed on said layer of cadmium sulfide;

g. an ionizable composite film disposed on said layer of metal platelets; and h. an electrically conductive layer disposed on said composite film, said last layer facing said electron beam and being transmissive thereto.

6. The display panel of claim 5 characterized further in that said metal platelets are silver, each less than ten microns in diameter.

7. The storage display device of claim 6 characterized further in that said ionizable composite film comprises conductive particles dispersed in an oxygen-containing insulating medium.

8. The display panel of claim 7 characterized further in that said conductive particles are selected from a group consisting of gold, aluminum, silver, platinum, palladium, copper, nickel and tin, and in that said insulating medium is silicon monoxide.

* * * * *